(12) United States Patent
Gibet et al.

(10) Patent No.: US 7,639,091 B2
(45) Date of Patent: Dec. 29, 2009

(54) DEVICE FOR GENERATION OF A REFERENCE FREQUENCY AND CORRESPONDING ELECTRONIC CIRCUIT

(75) Inventors: Stanislas Gibet, Carquefou (FR); Abdellatif Bendraoui, Saint-Julien de Concelles (FR); Mikael Tual, Saint-Nazaire (FR)

(73) Assignee: Atmel Switzerland SARL, Fribourg (CH)

( * ) Notice: Subject to any disclaimer, the term of this patent is extended or adjusted under 35 U.S.C. 154(b) by 101 days.

(21) Appl. No.: 11/490,737

(22) Filed: Jul. 20, 2006

(65) Prior Publication Data
US 2007/0176698 A1     Aug. 2, 2007

(30) Foreign Application Priority Data
Jul. 22, 2005    (FR) .................................. 05 07868

(51) Int. Cl.
*H03L 7/00*     (2006.01)

(52) U.S. Cl. ........................... 331/34; 331/16; 331/175; 331/176; 331/185

(58) Field of Classification Search .................... 331/34, 331/16, 175, 176, 185
See application file for complete search history.

(56) References Cited

U.S. PATENT DOCUMENTS

| 6,217,213 B1 * | 4/2001 | Curry et al. .................. 374/178 |
| 7,042,277 B2 * | 5/2006 | Cranford et al. ............. 327/538 |
| 2001/0038317 A1 | 11/2001 | Kasperkovitz ............... 331/25 |

OTHER PUBLICATIONS

Ting-Ping Liu et al., "A 250MHz Monolithic Voltage-Controlled Oscillator," 1988 IEEE International Solid-State Circuits Conference, Feb. 17, 1988, pp. 22-24.

H. Matsumo et al., "Switched-Capacitor Frequency-to-Voltage and Voltage-to-Frequency Converters Based on Charge-Balancing Principle," Research Institute of Electronic, Shizuoko University, Jun. 7, 1988, pp. 2221-2224.

* cited by examiner

*Primary Examiner*—Arnold Kinkead
(74) *Attorney, Agent, or Firm*—Westman Champlin & Kelly, P.A.; David D. Brush

(57) ABSTRACT

A device for generation of a reference frequency includes a component configured for generating a reference voltage, and a slaving circuit configured for slaving the reference frequency to the reference voltage.

17 Claims, 3 Drawing Sheets

DEVICE FOR GENERATION OF A REFERENCE FREQUENCY AND CORRESPONDING ELECTRONIC CIRCUIT

CROSS-REFERENCE TO RELATED APPLICATION

None.

FIELD OF THE INVENTION

This invention relates to the domain of generating a reference frequency.

More precisely, this invention relates to generation of a reference frequency from an integrated high precision oscillator (precision of the order of 5% or better) not requiring the use of external components.

BACKGROUND OF THE INVENTION

Prior art

Different types of oscillators are known with variable precision as a function of variations in operating conditions of the oscillator, in other words as a function of process, temperature and/or power supply voltage variations.

Thus some oscillators, for example such as quartz oscillators, can give a frequency precision of the order of 1%.

However, one disadvantage of these oscillators is that they are based on the use of at least one external component to increase their precision.

Similarly, some oscillators make use of components such as external resistors or capacitors, to generate a precise time base.

There are also oscillators, for example with a ring structure, that do not require the use of external components.

However, such oscillators usually have a lower precision (of the order of 30%) than oscillators using an external component.

A calibration system then has to be used to improve their precision, for example by adding bits for programming a delay or a capacitance, or using a matrix of fuses that can be burnt out during tests. The precision of such oscillators is of the order of 5%.

However, one disadvantage of these calibration systems is that they require the use of a register to be loaded (for example of the RAM (Random Access Memory) type) when programming bits are added, or a very large circuit surface area (of the order of twice the area of the oscillator) when a fuse matrix is used.

SUMMARY OF THE INVENTION

A device for generating a reference frequency includes a component configured for generating a reference voltage, and a slaving circuit configured for slaving the reference frequency to the reference voltage.

The device can be particularly beneficial because it can generate a reference frequency with a better precision than techniques according to prior art (of the order of 5% or better), without the use of external components to improve the precision of the oscillating frequency.

In addition, the device can be easy to implement and inexpensive to use because it can be designed to occupy a small space on an integrated circuit.

A general principle of the invention is that it is based on a quite new and inventive approach to slaving a frequency to a reference voltage rather than to a frequency, so as to generate a reference frequency with high precision (of the order of 1 to 5%).

In particular, the component for generating a reference voltage may include a Bandgap type generator in order to generate a stable and precise reference voltage.

The design thus provides an integrated oscillator generating a high precision reference frequency without requiring the use of external components.

Advantageously, the slaving circuit can comprise a converter for converting the reference frequency to a voltage, and outputting a voltage that is an image of the reference frequency.

The converter thus transforms the reference frequency into an image voltage so as to compare it with the reference voltage, and then to output a precise reference frequency.

In one embodiment, the slaving circuit also comprises a comparator for comparing the image voltage with the reference voltage, and a voltage-controlled oscillator outputting the reference frequency as a function of an output signal from the comparator.

The voltage-controlled oscillator (VCO) can be controlled by an output signal output from the comparator, comparing the image voltage of the reference frequency with the reference voltage.

Stated another way, the device is based on slaving of the VCO frequency to the reference voltage.

Advantageously, the converter comprises a frequency-voltage converter with a transfer function that is independent of the variations in operating conditions of the device.

In particular, variations in operating conditions relate to process, temperature and/or power supply voltage variations.

In one embodiment, the converter includes a charging circuit for charging at least one capacitor outputting an intermediate voltage, and a smoothing component for smoothing the intermediate voltage outputting the image voltage.

In particular, the smoothing component is used to extract the average value of the intermediate voltage, to output the image voltage.

According to a first embodiment, the charging circuit includes a resistor powered by a power supply voltage and connected to the input to the smoothing component, and a capacitor and a switch in parallel, connected between the ground and the input to the smoothing component, the switch being controlled by a switching signal at the reference frequency.

According to a second embodiment, the charging circuit includes a switched capacitor powered by a power supply voltage and connected to the input to the smoothing component, the switched capacitor comprising at least one switch controlled by a switching signal at the reference frequency, and a capacitor and a switch in parallel, connected between the ground and the input to the smoothing component, the switch being controlled by the switching signal.

In particular, the use of switched capacitors can give precise ratios between the various components (resistor, capacitor, etc.).

According to one variant of the invention, the device for generating a reference frequency can comprise a programming device for programming the component for generating a reference voltage and/or a programming device for programming the converter for converting the reference frequency into a voltage, so as to adjust the reference frequency.

In particular, the programming device can be used to modify the reference frequency generated by the device according to another aspect of the invention.

More precisely, according to one particular use of the invention, the component for generating a reference voltage may behave like a Phase Locked Loop (PLL) coupled to a conventional oscillator, for example to use a frequency synthesis.

Another aspect of the invention also relates to an electronic circuit comprising a device for generation of a reference frequency according to the invention, like that disclosed above.

Other characteristics and advantages of the invention will become clear after reading the following description of exemplary embodiment, given as a simple illustrative and non-limitative example, and the appended drawings among which:

DETAILED DESCRIPTION OF ILLUSTRATIVE EMBODIMENTS

A general principle of the invention is based on slaving of a reference frequency generated at the output from an oscillator to a reference voltage, rather than to a frequency. Accordingly, a device according to an aspect of the invention is based on the use of a component for generating and outputting a stable and precise reference voltage, and a slaving circuit for slaving the reference frequency to the reference voltage.

According to an aspect of the invention, the slaving circuit can comprise a frequency-voltage converter to convert the reference frequency into an image voltage, to compare this image voltage with the reference voltage, and to output an output signal controlling a voltage-controlled oscillator as a function of the result of the comparison, outputting the reference frequency.

Figure 1:
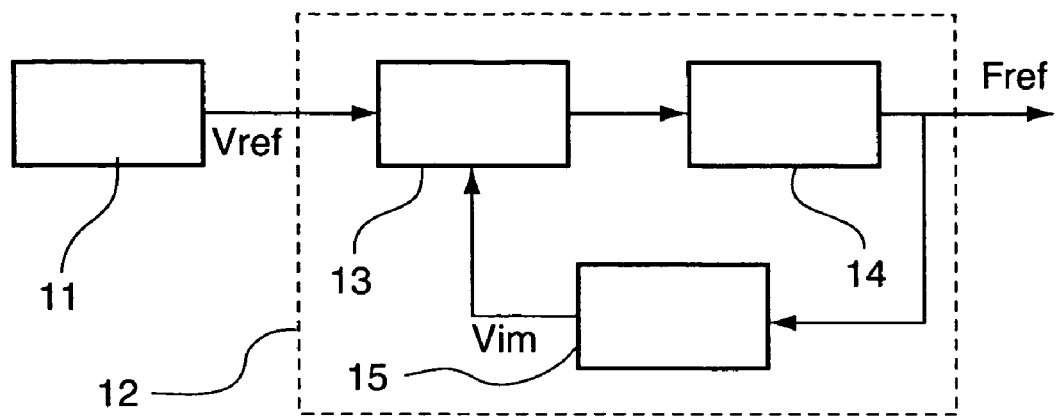
FIG. 1 shows general operation of a device for generating a reference frequency according to an aspect of the invention.

FIG. 1 shows an embodiment of the invention.

According to this embodiment, a device for generating a reference frequency $F_{ref}$ comprises a component 11 for generating a reference voltage, outputting a reference voltage $V_{ref}$, and a circuit 12 of slaving the reference frequency $F_{ref}$ to the reference voltage $V_{ref}$.

In particular, the reference voltage $V_{ref}$ may be generated by a Bandgap type generator, well known to a person skilled in the art for precision of the generated voltage with regard to variations in operating conditions (precision of the order of 1 to 5% with regard to process, temperature, power supply voltage variations, and variations in technological component manufacturing parameters, etc.).

More precisely, the slaving circuit 12 can comprise frequency-voltage converter 15 for converting the reference frequency $F_{ref}$ into an image voltage $V_{im}$, and comparator 13 for comparing the image voltage $V_{im}$ with the reference voltage $V_{ref}$.

According to this embodiment, the frequency-voltage converter 15 can have a transfer function K that is independent of variations in operating conditions of the device, in other words that is independent of process, temperature, and/or power supply voltage variations:

$$V_{im} = K \cdot F_{ref}$$

The comparator 13 provides an output signal proportional to the difference between the reference voltage $V_{ref}$ at the output from the voltage generator 11 and the voltage $V_{im}$ at the output from the frequency-voltage converter 15.

More precisely, the comparator 13 uses a subtraction of the image voltage $V_{im}$ from the reference voltage $V_{ref}$ and a multiplication of the result of this subtraction by a gain G outputting the output signal at the voltage $V_{VCO}$:

$$V_{VCO} = (V_{ref} - V_{im}) \cdot G$$

In particular, this output signal controls a voltage-controlled oscillator (VCO) 14, and a transfer function I, outputting a signal for which the reference frequency $F_{ref}$ varies as a function of the voltage $V_{VCO}$ applied to its input:

$$F_{ref} = V_{VCO} \cdot I$$

Thus, to generate a precise reference frequency, the frequency of the VCO 14 has to be slaved to a precise voltage, and therefore the VCO has to be controlled with the output signal output from the comparison between the reference voltage $V_{ref}$ generated by, for example, a Bandgap type generator 11 and the image voltage of the reference frequency $V_{im}$.

Such a voltage-controlled oscillator is conventional and is well known to a person skilled in the art, particularly in electronic circuits based on a phase locked loop (PLL).

Thus, an aspect of the invention proposes to generate a reference frequency $F_{ref}$ using conventional components, and particularly a reference voltage generator, a comparator and a voltage-controlled oscillator.

The precision of the generated reference frequency is then based on the frequency-voltage converter, and can be written in the form:

$$F{ref} = V_{VCO} \cdot I = (V_{ref} - V_{im}) \cdot G \cdot I = (V_{ref} - K \cdot F_{ref}) \cdot G \cdot I = V_{ref} G \cdot I - K \cdot F_{ref} G \cdot I$$

or $$F_{ref} \cdot (1 + K \cdot G \cdot I) = V_{ref} G \cdot I$$

or $$F_{ref} = V_{ref} (G \cdot I)/(1 + K \cdot G \cdot I)$$

The result is that the precision of the reference frequency $F_{ref}$ is the same as the precision of the reference voltage $V_{ref}$.

Thus, if the component 11 for generating a reference voltage include a Bandgap type generator with a precision of the order of 1 to 5%, the precision of the reference frequency $F_{ref}$ generated by the generation device will be of the order of 1 to 5%.

Furthermore, the device may be fully integrated since it does not require the use of external components.

However, it is worth noting that the oscillator according to the invention can be made on two different circuits, a first conventional Bandgap type of circuit comprising component 11 for generating a reference voltage and a second circuit comprising the slaving circuit 12 for slaving the reference frequency $F_{ref}$ to the reference voltage $V_{ref}$, supplied with power by the reference voltage $V_{ref}$.

It should also be noted that when the reference voltage $V_{ref}$ is equal to the image voltage $V_{im}$, the reference frequency $F_{ref}$ at the output from the device becomes zero.

If the reference frequency $F_{ref}$ becomes zero, the image voltage $V_{im}$ will also be zero, and the output voltage from the comparator 13 becomes:

$$V_{VCO}=(Vref-V_{im}).G=V_{ref}G$$

In this case, according to the above equations, the reference frequency $F_{ref}$ can be written in the following form:

$$F_{ref}=V_{VCO}.I=V_{ref}G.I$$

It can be deduced that the state according to which the reference voltage $V_{ref}$ is equal to the image voltage $V_{im}$, is not a stable state.

This instability is specific to systems comprising a reaction loop; the reaction loop tends to create equality between the reference voltage $V_{ref}$ and the image voltage $V_{im}$, and once this equality has been reached, the reference frequency $F_{ref}$ decreases, then the image voltage $V_{im}$ varies again, and the reaction loop once again tends to create equality.

Thus, as in any system containing a reaction loop, it is desirable to add a delay element for stability of the system.

Figure 2A:
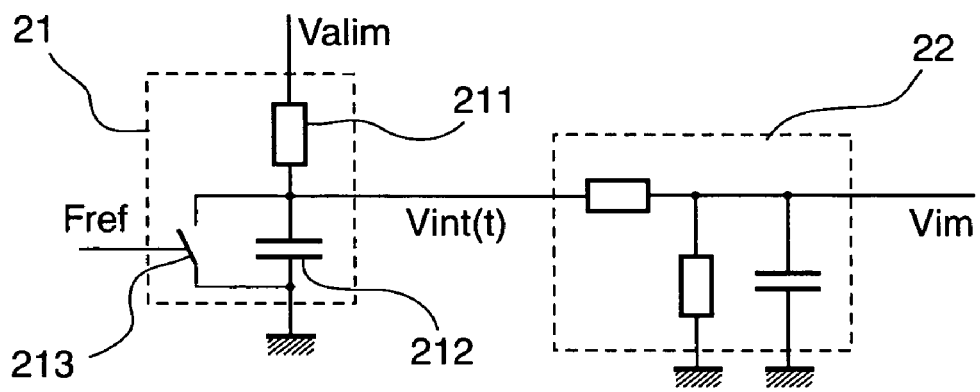
FIGS. 2A and 2B show two variant embodiments of the frequency-voltage converter of the device shown in FIG. 1.
Figure 2B:
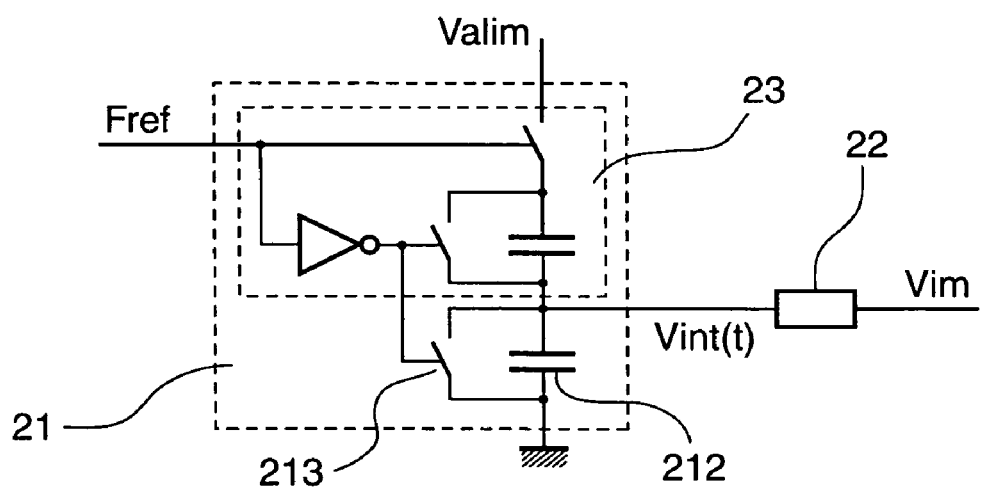

We will now disclose two embodiments of the frequency-voltage converter 15 with reference to FIGS. 2A and 2B.

According to a first embodiment shown in FIG. 2A, the frequency-voltage converter 15 comprises a charging circuit 21 for charging at least one capacitor, outputting an intermediate voltage $V_{int(t)}$ that varies with time, and smoothing component 22 that smooths the intermediate voltage $V_{int(t)}$ outputting the image voltage $V_{im}$.

The charging circuit can comprise in particular:

a resistor 211 powered by a power supply voltage $V_{alim}$ and connected to the input to the smoothing component 22; and a capacitor 212 and a switch 213 in parallel, connected between the ground and the input to the smoothing component 22, the switch 213 being controlled by a switching signal at the reference frequency $F_{ref}$.

Figure 3A:
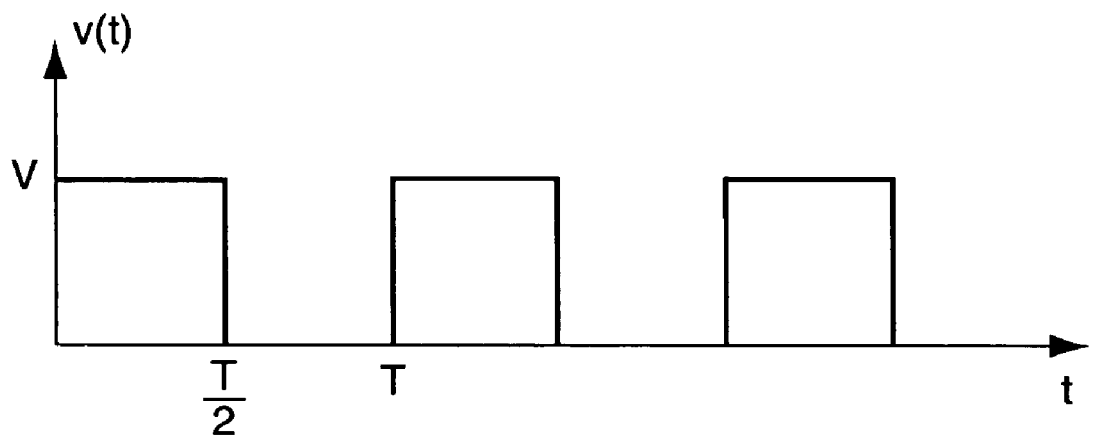
FIGS. 3A to 3C show voltage variations of the frequency-voltage converter in FIGS. 2A and 2B, as a function of the charge or discharge of a capacitor.

In particular, FIG. 3A shows the signal switching the capacitor 212 to the frequency $F_{ref}$ controlling the switch 213.

Thus, during a first period T/2, the switch 213 is open and the capacitor 212 charges, and during the next period T/2 the switch 213 is closed and the capacitor 212 discharges (with $T=1/F_{ref}$).

Figure 3B:
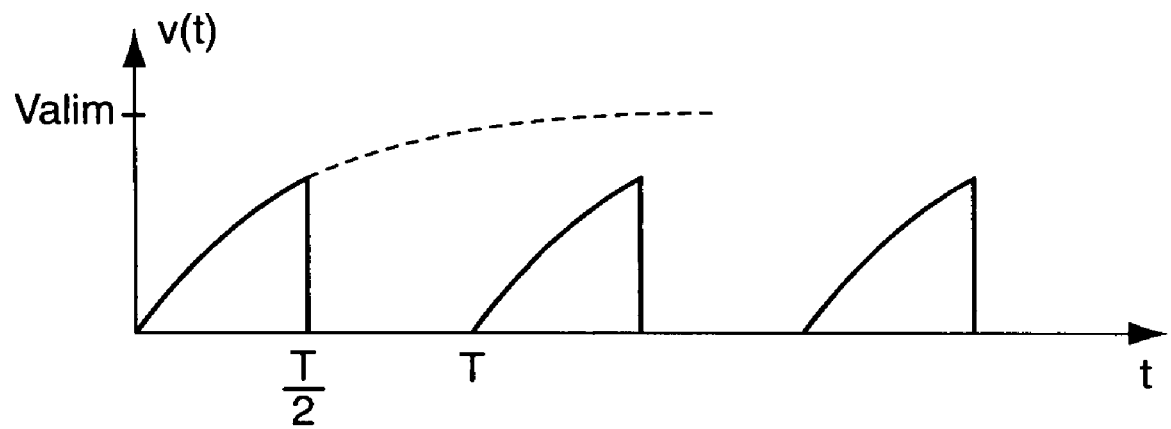

FIG. 3B more precisely shows variations in the intermediate voltage $V_{int(t)}$ at the terminals of the capacitor 212 as a function of time.

Thus, during the first period T/2, the intermediate voltage $V_{int(t)}$ at the terminals of the capacitor 212 increases non-linearly (transient condition) in order to reach the value of the power supply voltage $V_{alim}$ (in dashed lines on the figure). When the switch 213 closes (next period T/2) creating a short circuit at the frequency Fref, the capacitor 212 suddenly discharges and the intermediate voltage $V_{int(t)}$ at the terminals of the capacitor 212 becomes practically zero. The parameters that affect the speed of this change are the resistor 211 and the capacitor 212.

Figure 3C:
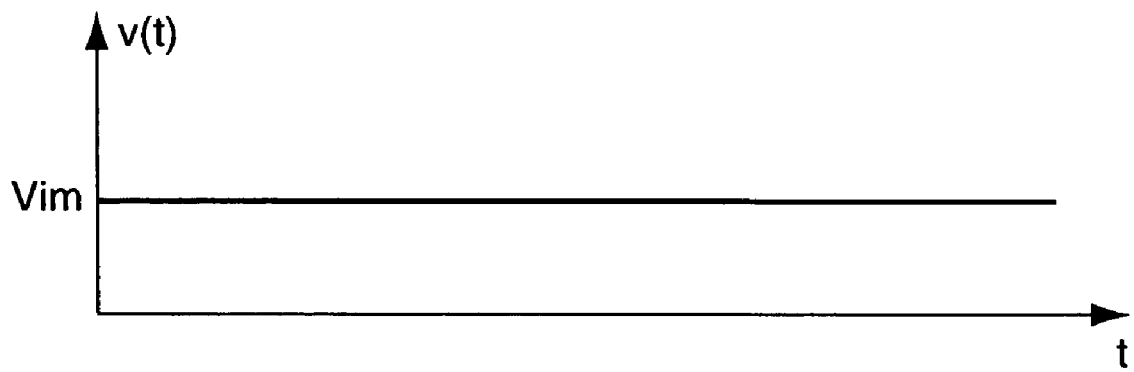

The frequency-voltage converter 15 also comprises smoothing the intermediate voltage $V_{int(t)}$ with smoothing component 22 in order to extract the average value of the intermediate voltage, and outputting the image voltage $V_{im}$, as shown in FIG. 3C.

For example, the smoothing component 22 can comprise a first resistor powered by the intermediate voltage $V_{int(t)}$, and a second resistor and capacitor in parallel connected between the ground and the output from the first resistor, outputting a signal at the image voltage $V_{im}$.

According to a second embodiment shown in FIG. 2B, the frequency-voltage converter 15 includes charging circuit 21 for charging at least one capacitor outputting an intermediate voltage $V_{int(t)}$ that varies with time, and smoothing component 22 for smoothing the intermediate voltage $V_{int(t)}$ outputting the image voltage $V_{im}$.

More precisely, the charging circuit 21 can comprise:

a switched capacitor 23 powered by a power supply voltage $V_{alim}$ and connected to the input to the smoothing component 22, the switched capacitor 23 comprising at least one switch controlled by a switching signal at the reference frequency; and a capacitor 212 and a switch 213 in parallel, connected between the ground and the input to the smoothing component 22, the switch being controlled by the switching signal.

In other words, the resistor 211 in the first embodiment of the frequency-voltage converter is replaced by a system 23 with switched capacitors. The use of switched capacitors in particular can give precise ratios between the different components (resistor, capacitor, etc.) and consequently, give a precise image voltage $V_{im}$.

It should be noted that switched capacitors are conventionally used in the generation of filters.

On the other hand, an aspect of the invention is based on an innovative use of switched capacitors for conversion of a frequency into a voltage. Thus, according to this aspect of the invention, the switches of the switched capacitors are controlled by a switching signal at the reference frequency $F_{ref}$. Therefore the reference frequency in this case is used as an input data to the switched capacitor system.

Operation of the capacitor 212 and the switch 213 in parallel, and operation of the smoothing component 22 already shown with reference to FIG. 2A, is not disclosed in more detail.

Figure 4:
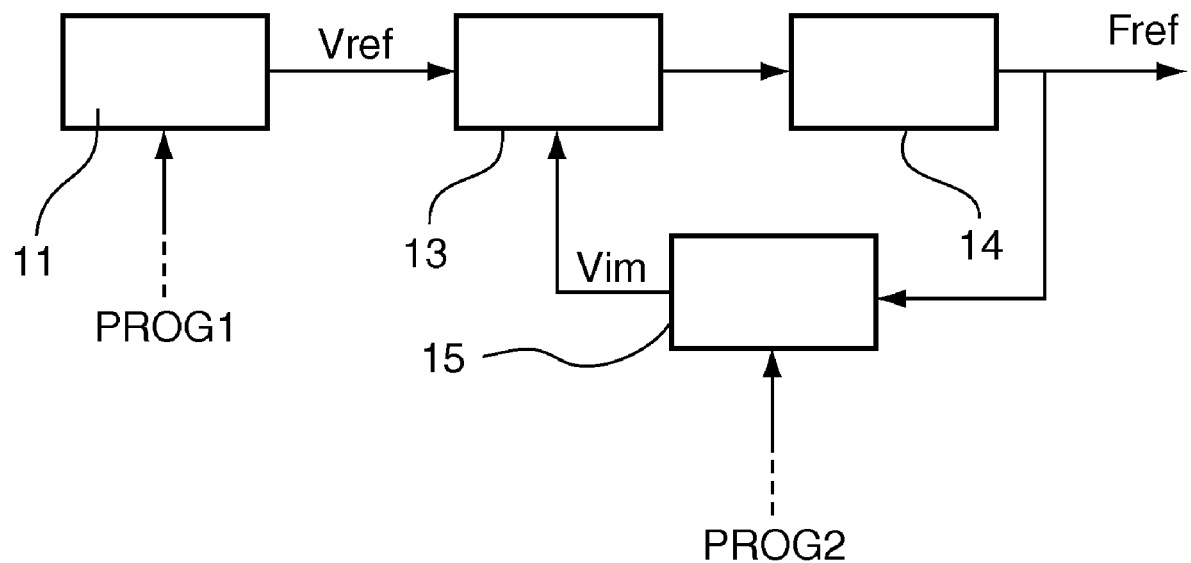
FIG. 4 shows a variant embodiment of the invention according to which the reference frequency generated by the device in FIG. 1 is adjustable.

We will now disclose a variant embodiment with reference to FIG. 4, in which the reference frequency $F_{ref}$ is adjustable.

More precisely, according to this variant of the invention, the reference frequency generation device comprises a programming device PROG1 for programming the component 11 for generating a reference voltage and/or a programming device PROG2 for programming the converter 15 for converting the reference frequency into a voltage.

As described above, the reference frequency output from the device can be expressed in the following form:

$$F_{ref}=V_{ref}(G.I)/(1+K.G.I)$$

Consequently, if the value of the transfer function K of the frequency-voltage converter 15 can be programmed using the programming device PROG2, or if the value of the reference voltage $V_{ref}$ can be programmed with the programming device PROG1, then the reference frequency $F_{ref}$ generated by the oscillator can be adjusted differently as a function of the applications.

Thus, either the reference voltage generation component 11 or the frequency-voltage converter 15 or both can be programmed, if it is desired to be able to adjust the reference frequency during use.

This can be done by having a frequency-controlled oscillator 14 that covers the necessary frequency range, and being able to adapt the transmittance of the frequency-voltage converter. It should be noted that one predicted operating range is of the order of 12 to 500 MHz.

One example application is the production of a frequency synthesizer by programming the reference frequency generation component 11 and/or the frequency-voltage converter 15.

The reference frequency generation device according to the invention can thus replace a conventional frequency synthesis system combining a quartz oscillator with a phase locked loop (PLL).

Figure 5:
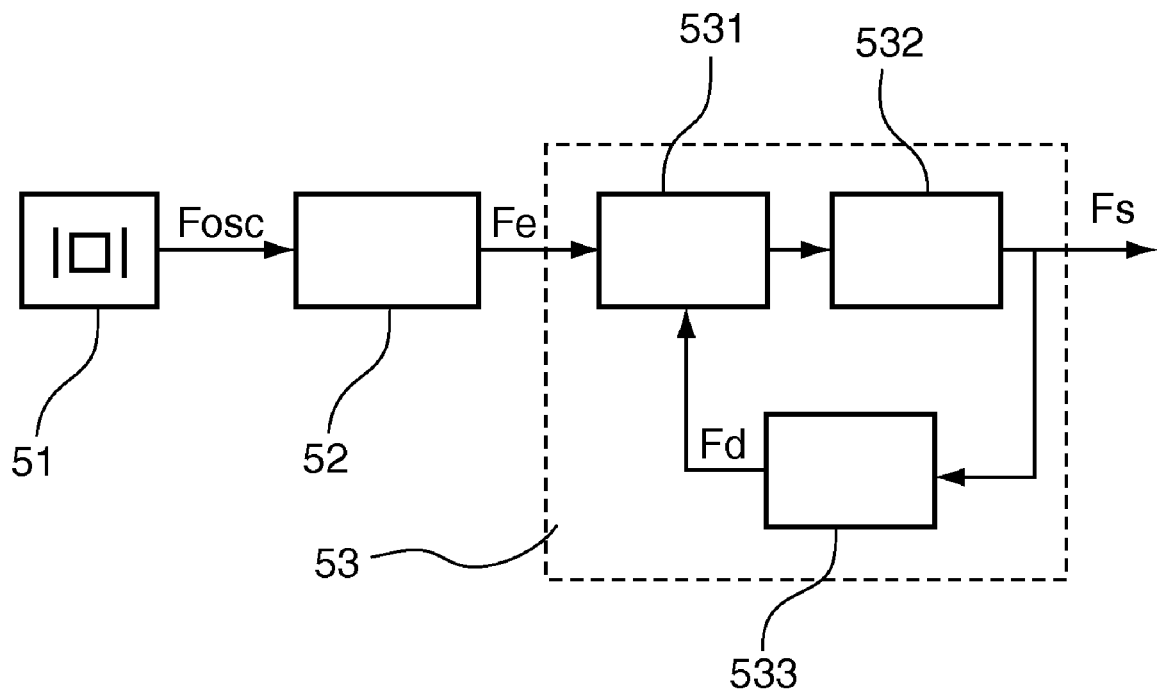
FIG. 5 shows a frequency synthesiser according to prior art.

More precisely, a conventional frequency synthesizer like that shown in FIG. 5 combines a quartz oscillator 51 outputting a frequency $F_{osc}$ with a phase locked loop 53, through a frequency divider 52 outputting an input frequency $F_e$.

Such a phase locked loop 53 comprises at least one phase comparator 531, a voltage-controlled oscillator 532 (VCO) and a divider 533, and can be used to generate an arbitrary frequency with the same precision as the quartz oscillator.

More precisely, the comparator 531 compares the input frequency $F_e$ and the output frequency $F_d$ from the PLL divider 533 inserted into the reaction loop between the output from the VCO 532 and the input to the comparator 531, and outputs a control signal controlling the voltage-controlled oscillator 532. The VCO 532 outputs an output signal at the frequency $F_s$.

Thus, a conventional frequency synthesizer like that shown in FIG. 5, in other words comprising a quartz oscillator and a PLL, can be replaced by a reference frequency generation device.

Therefore, a precise quartz oscillator can be replaced by an integrated precise oscillator and which does not require the use of any external components, and the need for the phase locked loop is eliminated by modifying the oscillator parameters, starting from programming device PROG1 and/or PROG2.

For example, it is possible to modify the threshold of the comparator 13 for comparing the reference voltage $V_{ref}$ with the image voltage $V_{im}$, by modifying the value of the reference voltage $V_{ref}$.

Finally, the oscillator, is used to supply a precise reference frequency without using external components and, depending on its application, can replace the "quartz oscillator—PLL" pair used in the frequency synthesis.

What is claimed is:

1. A device for generation of a reference frequency comprising:
   a component configured to generate a reference voltage; and
   a slaving circuit configured for slaving said reference frequency to said reference voltage and comprising:
      a frequency-voltage converter having a transfer function that is independent of variations in operating conditions of said device and being configured for converting said reference frequency to a voltage and outputting an image voltage of said reference frequency.

2. The device for generation of a reference frequency according to claim 1, wherein said slaving circuit also comprises a comparator configured for comparing said image voltage with said reference voltage, and a voltage-controlled oscillator configured for outputting said reference frequency as a function of an output signal from said comparator.

3. The device for generation of a reference frequency according to claim 2, wherein said converter comprises a charging circuit configured for charging at least one capacitor outputting an intermediate voltage, and a smoothing component configured for smoothing said intermediate voltage outputting said image voltage.

4. The device for generation of a reference frequency according to claim 3, wherein said charging circuit comprises:
   a resistor powered by a power supply voltage and connected to the input to said smoothing component;
   a capacitor and a switch in parallel, connected between the ground and the input to said smoothing component, said switch being controlled by a switching signal at said reference frequency.

5. The device for generation of a reference frequency according to claim 3, wherein said charging circuit comprises:
   a switched capacitor powered by a power supply voltage and connected to the input to said smoothing component, said switched capacitor comprising at least one switch controlled by a switching signal at the reference frequency; and
   a capacitor and a switch in parallel, connected between the ground and the input to said smoothing component, said switch being controlled by said switching signal.

6. The device for generation of a reference frequency according to 5, wherein said component configured for generating a reference voltage includes a Bandgap type generator.

7. The device for generation of a reference frequency according to claim 6, a further comprising a programming device configured for programming said component for generating a reference voltage and/or a programming device configured for programming said converter for converting said reference frequency into a voltage, in order to adjust said reference frequency.

8. The device for generation of a reference frequency according to claim 1, wherein said converter comprises a charging circuit configured for charging at least one capacitor outputting an intermediate voltage, and a smoothing component configured for smoothing said intermediate voltage outputting said image voltage.

9. The device for generation of a reference frequency according to claim 8, wherein said charging circuit comprises:
   a resistor powered by a power supply voltage and connected to the input to said smoothing component;
   a capacitor and a switch in parallel, connected between the ground and the input to said smoothing component, said switch being controlled by a switching signal at said reference frequency.

10. The device for generation of a reference frequency according to claim 8, wherein said charging circuit comprises:
    a switched capacitor powered by a power supply voltage and connected to the input to said smoothing component, said switched capacitor comprising at least one switch controlled by a switching signal at the reference frequency; and
    a capacitor and a switch in parallel, connected between the ground and the input to said smoothing component, said switch being controlled by said switching signal.

11. The device for generation of a reference frequency according to claim 2, wherein said converter comprises a charging circuit configured for charging at least one capacitor outputting an intermediate voltage, and a smoothing component configured for smoothing said intermediate voltage outputting said image voltage.

12. The device for generation of a reference frequency according to 1, wherein said component configured for generating a reference voltage includes a Bandgap type generator.

13. The device for generation of a reference frequency according to claim 1, a further comprising a programming device configured for programming said component for generating a reference voltage and/or a programming device configured for programming said converter for converting said reference frequency into a voltage, in order to adjust said reference frequency.

14. An electronic circuit comprising a device for generation of a reference frequency according to claim 1.

15. An electronic circuit comprising a device for generation of a reference frequency according to claim 7.

16. A device for generation of a reference frequency comprising:
   a component configured to generate a reference voltage; and
   a slaving circuit configured for slaving said reference frequency to said reference voltage and comprising:
      a converter configured for converting said reference frequency to a voltage, and outputting an image voltage of said reference frequency, wherein the converter comprises a charging circuit configured for charging at least one capacitor outputting an intermediate voltage, and a smoothing component configured for smoothing said intermediate voltage to output said image voltage; and
      a comparator configured for comparing said image voltage with said reference voltage, and a voltage-controlled oscillator configured for outputting said reference frequency as a function of an output signal from said comparator.

17. A device for generation of a reference frequency comprising:
   a component configured to generate a reference voltage;
   a slaving circuit configured for slaving said reference frequency to said reference voltage and comprising:
      a converter configured for converting said reference frequency to a voltage, and outputting an image voltage of said reference frequency; and
   at least one of a programming device configured for programming said component for generating a reference voltage, or a programming device configured for programming said converter for converting said reference frequency into a voltage, in order to adjust said reference frequency.

* * * * *

UNITED STATES PATENT AND TRADEMARK OFFICE
CERTIFICATE OF CORRECTION

| | | |
|---|---|---|
| PATENT NO. | : 7,639,091 B2 | Page 1 of 1 |
| APPLICATION NO. | : 11/490737 | |
| DATED | : December 29, 2009 | |
| INVENTOR(S) | : Gibet et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 263 days.

Signed and Sealed this

Twenty-first Day of December, 2010

David J. Kappos
*Director of the United States Patent and Trademark Office*